(12) United States Patent
Kim

(10) Patent No.: US 8,946,706 B2
(45) Date of Patent: Feb. 3, 2015

(54) TEST PATTERN OF SEMICONDUCTOR DEVICE, METHOD OF MANUFACTURING TEST PATTERN AND METHOD OF TESTING SEMICONDUCTOR DEVICE BY USING TEST PATTERN

(75) Inventor: Chang Kil Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 287 days.

(21) Appl. No.: 13/599,834

(22) Filed: Aug. 30, 2012

(65) Prior Publication Data

US 2013/0147509 A1    Jun. 13, 2013

(30) Foreign Application Priority Data

Dec. 13, 2011   (KR) .................. 10-2011-0133731

(51) Int. Cl.
*H01L 23/58* (2006.01)

(52) U.S. Cl.
USPC ............. 257/48; 257/202; 257/208; 257/211; 257/401; 257/E21.521; 257/E21.522; 257/E21.523; 257/E21.524

(58) Field of Classification Search
CPC ...................... H01L 2224/48227; H01L 22/34; H01L 23/544; H01L 2223/54453; H01L 2224/48463; H01L 2924/14

USPC ............. 438/5, 10–14, 17, 18, 199, 233, 128, 438/129; 257/48, E21.521–E21.531, 401, 257/202, 208, 211

See application file for complete search history.

(56) References Cited

U.S. PATENT DOCUMENTS

| | | | | |
|---|---|---|---|---|
| 5,898,228 | A | * | 4/1999 | Sugasawara .................. 257/797 |
| 2001/0026960 | A1 | * | 10/2001 | Trivedi ........................... 438/128 |
| 2006/0166384 | A1 | * | 7/2006 | Tatsumi .......................... 438/17 |

* cited by examiner

*Primary Examiner* — Yasser A Abdelaziez
*Assistant Examiner* — Farun Lu
(74) *Attorney, Agent, or Firm* — IP & T Group LLP

(57) ABSTRACT

A test pattern of a semiconductor device includes a plurality of active regions defined in a semiconductor substrate and arranged in parallel with each other, a plurality of gate patterns formed over the plurality of active regions, a plurality of gate contacts formed over the plurality of gate patterns, first junction contacts formed over respective end portions of odd-numbered active regions among the plurality of active regions, second junction contacts formed over respective end portions of even-numbered active regions among the plurality of active regions, and a contact pad configured to couple the first junction contacts and the plurality of gate contacts.

17 Claims, 2 Drawing Sheets

TEST PATTERN OF SEMICONDUCTOR DEVICE, METHOD OF MANUFACTURING TEST PATTERN AND METHOD OF TESTING SEMICONDUCTOR DEVICE BY USING TEST PATTERN

CROSS-REFERENCE TO RELATED APPLICATION

Priority is claimed to Korean patent application number 10-2011-0133731 filed on Dec. 13, 2011, the entire disclosure of which is incorporated herein by reference in its entirety.

BACKGROUND

1. Field of Invention

An embodiment of the present invention relates to a test pattern of a semiconductor device, a method of manufacturing the test pattern and a method of testing the semiconductor device by using the test pattern and, more particularly, to a test pattern of a semiconductor device for testing gate pads thereof for alignment, a method of manufacturing the test pattern and a method of testing the semiconductor device by using the test pattern.

2. Description of Related Art

With increasing integration degree of semiconductor devices, it is important to reduce the sizes of components that constitute the semiconductor devices, contacts that electrically couple the components and relevant regions.

As the sizes of the contacts and the components of the semiconductor devices are reduced, overlap margin therebetween may also be reduced. As a result, misalignment may occur between the contacts and the components. In order to test the contacts and components for alignment, a test pattern may be formed in a scribe region of a semiconductor device.

BRIEF SUMMARY

An embodiment relates to a test pattern of a semiconductor device for detecting a misalignment between gates and contacts of an X decoder of a semiconductor device, a method of manufacturing the test pattern and a method of testing the semiconductor device by using the test pattern.

A test pattern of a semiconductor device according to an embodiment of the present invention includes a plurality of active regions defined in a semiconductor substrate and arranged in parallel with each other, a plurality of gate patterns formed over the plurality of active regions, a plurality of gate contacts formed over the plurality of gate patterns, first junction contacts formed over respective end portions of odd-numbered active regions among the plurality of active regions, second junction contacts formed over respective end portions of even-numbered active regions among the plurality of active regions, and a contact pad configured to couple the first junction contacts and the plurality of gate contacts.

A semiconductor device according to an embodiment of the present invention includes an X decoder including first gate patterns and first gate contacts and configured to select word lines of a memory cell block, a plurality of active regions defined in a scribe region of a semiconductor substrate and arranged in parallel with each other, a plurality of second gate patterns formed over the plurality of active regions, a plurality of second gate contacts formed over the plurality of second gate patterns, wherein the second gate patterns and gate contacts have the same structures as the first gate patterns and gate contacts of the X decoder, first and second junction contacts formed over respective end portions of the plurality of active regions, and a first contact pad configured to couple the first junction contacts and the plurality of second gate contacts.

A test pattern of a semiconductor device according to an embodiment of the present invention includes first active regions and second active regions defined in a scribe region of a semiconductor substrate and alternating with each other, a plurality of gate patterns formed over the first active regions and the second active regions, respectively, a plurality of gate contacts formed over the plurality of gate patterns, at least one first contact formed over the first active regions, at least one second contact formed over the second active regions, and a contact pad configured to couple one of the first and second contacts and the plurality of gate contacts.

A method of forming a test pattern of a semiconductor device according to an embodiment of the present invention includes defining a plurality of active regions by performing an isolation process on a semiconductor substrate, forming a plurality of gate patterns over the plurality of active regions, forming a plurality of gate contacts coupled to top portions of the plurality of gate patterns, forming first and second junction contacts coupled to respective end portions of the plurality of active regions, and forming a first contact pad coupled to the first junction contacts and the plurality of gate contacts.

A method of testing a semiconductor device, which includes a plurality of second gate patterns and a plurality of second gate contacts over first and second active regions the same structure as first gate patterns and first gate contacts of an X decoder, according to an embodiment of the present invention includes coupling a first terminal (+) to at least one first contact coupled to the first active regions, coupling a second terminal (−) to at least one second contact coupled to the second active regions, and testing whether or not current flows between the first terminal and the second terminal.

DESCRIPTION OF EMBODIMENTS

Hereinafter, various embodiments of the present disclosure will be described in detail with reference to the accompanying drawings. The figures are provided to enable those of ordinary skill in the art to make and use the present invention according to the exemplary embodiments of the present invention.

A test pattern and a method of forming the test pattern to detect misalignment between gates of a plurality of transistors and contacts coupled to the gates of the transistors. The transistors may be included in an X decoder configured to selectively couple global word lines and word lines of a memory cell block of a semiconductor device according to an embodiment of the present invention.

FIGS. 1 to 4 are three-dimensional views of a semiconductor device according to an embodiment of the present invention.

Figure 1:
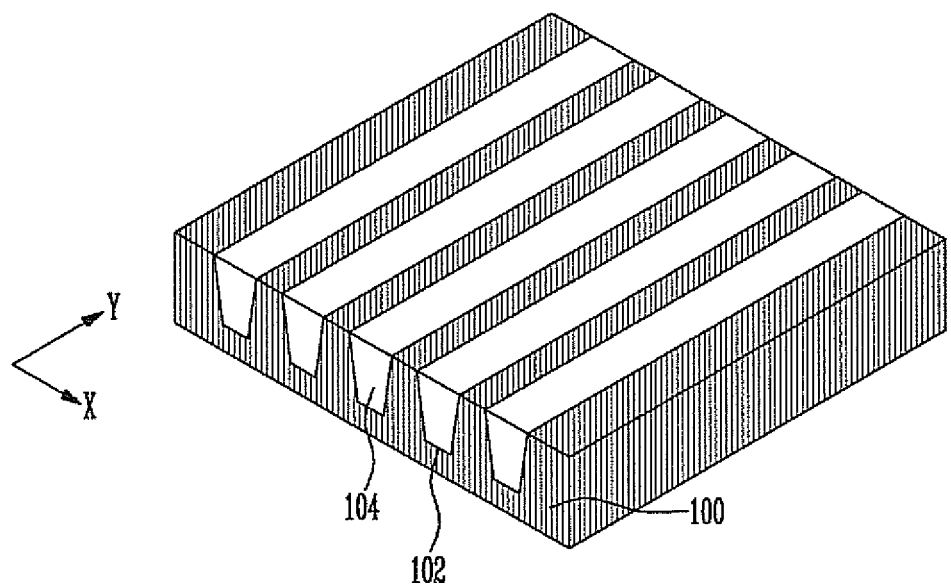
FIGS. 1 to 4 are three-dimensional views of a semiconductor device according to an embodiment of the present invention.

Referring to FIG. 1, an etch process may be performed on a scribe region of a semiconductor substrate 100, thus to form a plurality of trenches 102. Subsequently, the plurality of trenches 102 may be filled with insulating layers to thus form a plurality of isolation layers 104. The plurality of isolation layers 104 may be arranged in parallel with each other. The scribe region of the semiconductor substrate 100 may be divided into active regions and isolation regions by the plurality of isolation layers 104.

The above-described isolation process may be also performed on an X decoder region of the semiconductor substrate 100 where an X decoder, that is configured to selectively couple global word lines and word lines of a memory cell block of the semiconductor device, is to be formed, so that the scribe region and the X decoder region may have substantially the same structure as each other.

Figure 2:
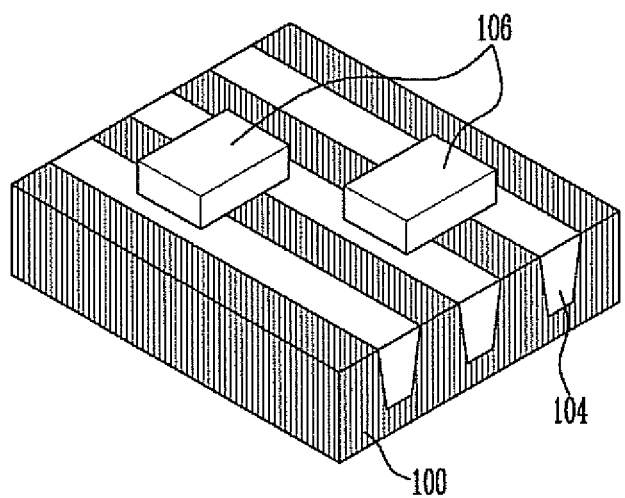

Referring to FIG. 2, gate patterns 106 may be formed over the active regions of the scribe region of the semiconductor substrate 100. Each of the gate patterns 106 may be formed over each of the active regions. The gate patterns 106 formed over the active regions may be spaced apart by a given distance such that the gate patterns 106 may be electrically insulated from each other. Each of the gate patterns 106 may be formed of a polysilicon layer.

The above-described processes of forming the gate patterns 106 may be performed at the same time as processes of forming gates for transistors of the X decoder are performed, so that the scribe region and the X decoder region may have substantially the same structure as each other.

Figure 3:
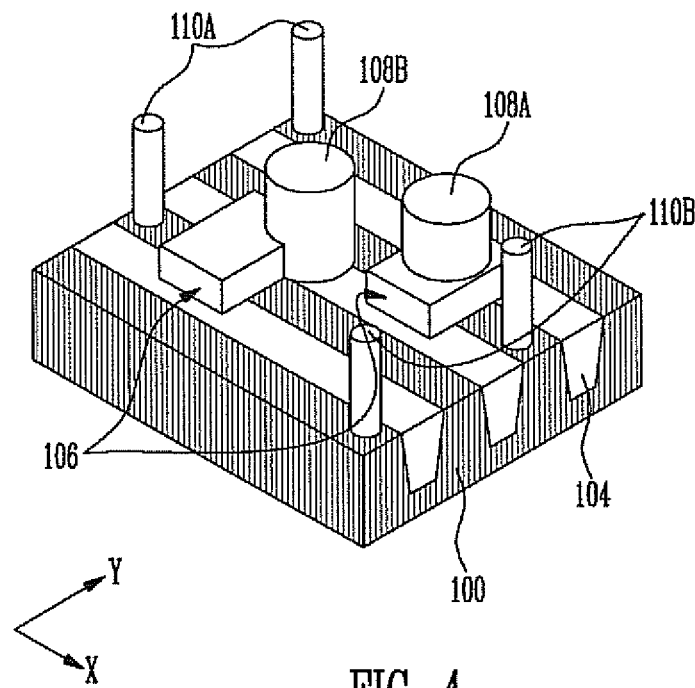

Referring to FIG. 3, gate contacts 108A and 108B may be formed over the gate patterns 106, respectively, so that the gate contacts 108A and 108B may be coupled to the gate patterns 106, respectively. At this time, in order for the gate contact 108A to be electrically coupled to the gate pattern 106 without causing misalignment therebetween, the gate contact 108A is to be formed at the upper center of the gate pattern 106. However, when misalignment occurs, the gate contact 108B may extend from a corresponding active region to neighboring active regions of the semiconductor substrate 100.

First and second junction contacts 110A and 110B may be formed over end portions of the plurality of active regions arranged in parallel in the semiconductor substrate 100. For example, the first junction contacts 110A may be formed over end portions of even-numbered active regions, while the second junction contacts 110B may be formed over end portions of odd-numbered active regions. Here, the first junction contacts 110A and the second junction contacts 110B are formed over the end portions, opposite to each other, of the even-numbered and odd-numbered active regions, respectively.

Figure 4:
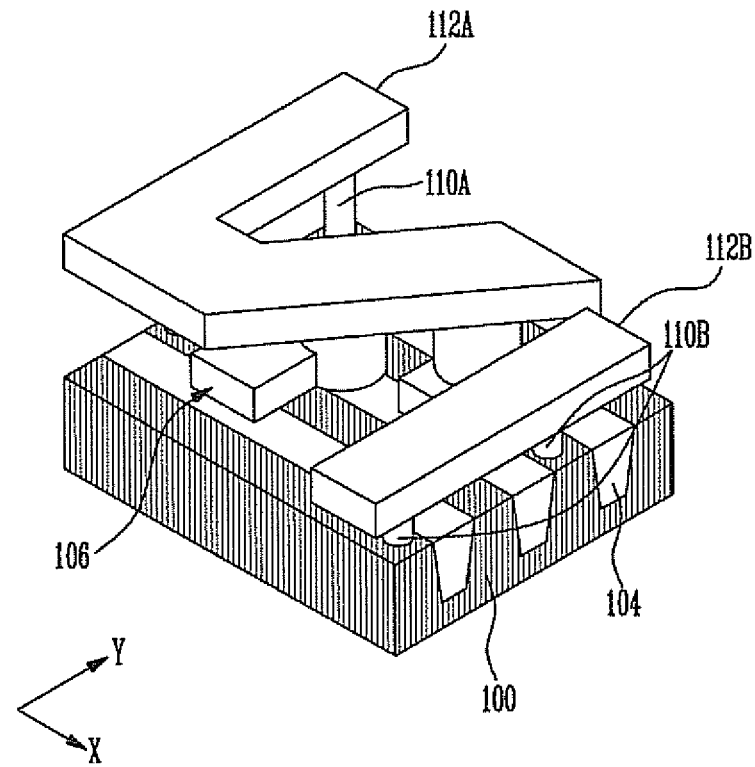

Referring to FIG. 4, a first contact pad 112A is formed such that the first contact pad 112A may be coupled to top portions of the first junction contacts 110A and the gate contacts 108A and 108B. In addition, a second contact pad 112B is formed such that the second contact pad 112B may be coupled to top portions of the second junction contacts 110B.

A first terminal (+) may be coupled to the first contact pad 112A during a test operation, and a second terminal (−) may be coupled to the second contact pad 112B during a test operation.

When the first terminal and the second terminal are coupled to the first contact pad 112A and the second contact pad 112B, respectively, during the test operation, misalignment of the gate contacts 108A and 108B may be detected by testing whether or not current flows between the first terminal and the second terminal.

In an embodiment of the present invention, two gate patterns and two contacts corresponding to each of the two gate patterns are depicted for illustration purposes. However, the number of test patterns may be equal to the number of transistors included in the X decoder of the semiconductor device, and a test operation may be performing using these test patterns.

As described above, according to an embodiment of the present invention, a test pattern having the same structure as an X decoder may be formed in a scribe region of a semiconductor substrate, and the test pattern may be used to detect misalignment between gate patterns and contacts of the X decoder by performing a test operation of coupling test terminals to contacts coupled to active regions and gate patterns of the test pattern.

According to an embodiment of the present invention, misalignment margin during processing may be checked by forming a test pattern used to detect misalignment between gates and contacts of an X decoder of a semiconductor device, thus to determine the optimal size of a gate pad and the optimal size of a contact.

What is claimed is:

1. A test pattern of a semiconductor device, the test pattern comprising:
   a plurality of active regions defined in a semiconductor substrate and arranged in parallel with each other;
   a plurality of gate patterns formed over the plurality of active regions;
   a plurality of gate contacts formed over the plurality of gate patterns;
   first junction contacts formed over respective end portions of odd-numbered active regions among the plurality of active regions;
   second junction contacts formed over respective end portions of even-numbered active regions among the plurality of active regions; and
   a contact pad configured to couple the first junction contacts and the plurality of gate contacts,
   wherein the active regions, the gate patterns, the gate contacts, the first and second junction contacts, and the contact pad are formed in a scribe region defined in the semiconductor substrate.

2. The test pattern of claim 1, wherein the plurality of gate patterns and the plurality of gate contacts are formed in a scribe region of the semiconductor substrate with substantially the same structures as gate patterns and gate contacts of an X decoder.

3. The test pattern of claim 1, wherein a first terminal (+) is coupled to the contact pad, and a second terminal (−) is coupled to the second junction contacts.

4. The test pattern of claim 1, wherein the end portions of the odd-numbered active regions are disposed opposite the end portions of the even-numbered active regions.

5. A semiconductor device, comprising:
   an X decoder including first gate patterns and first gate contacts and configure to select word lines of a memory cell block;
   a plurality of active regions defined in a scribe region of a semiconductor substrate and arranged in parallel with each other;
   a plurality of second gate patterns formed over the plurality of active regions;
   a plurality of second gate contacts formed over the plurality of second gate patterns, wherein the second gate patterns and the second gate contacts have the same structures as the first gate patterns and the first gate contacts of the X decoder;
   first and second junction contacts formed over respective end portions of the plurality of active regions; and
   a first contact pad configured to couple the first junction contacts and the plurality of second gate contacts.

6. The semiconductor device of claim 5, further comprising:
   a second contact pad configured to couple the second junction contacts.

7. A test pattern of a semiconductor device, the test pattern comprising:
   first active regions and second active regions defined in a scribe region of a semiconductor substrate and alternating with each other;
   a plurality of gate patterns formed over the first active regions and the second active regions, respectively;
   a plurality of gate contacts formed over the plurality of gate patterns;
   at least one first contact formed over the first active regions; and
   at least one second contact formed over the second active regions.

8. The test pattern of claim 7, wherein the first contact is coupled to a first terminal (+), and the second contact is coupled to the second terminal (−).

9. A method of forming a test pattern of a semiconductor device, the method comprising:
   defining a plurality of active regions by performing an isolation process on a semiconductor substrate;
   foaming a plurality of gate patterns over the plurality of active regions;
   forming a plurality of gate contacts coupled to top portions of the plurality of gate patterns;
   forming first and second junction contacts coupled to respective end portions of the plurality of active regions; and
   forming a first contact pad coupled to the first junction contacts and the plurality of gate contacts,
   wherein the active regions, the gate patterns, the gate contacts, the first and second junction contacts and the first contact pad are formed in a scribe region defined in the semiconductor substrate.

10. The method of claim 9, wherein the forming of the plurality of gate patterns and the plurality of gate contacts is performed in a process of forming gates patterns and gate contacts for transistors of an X decoder of the semiconductor device.

11. The method of claim 10, wherein the plurality of gate patterns and the plurality of gate contacts have the same structures as the gates patterns and the gate contacts of the X decoder, respectively.

12. The method of claim 9, wherein the forming of the first and second junction contacts coupled to the respective end portions of the plurality of active regions comprises:
   forming the first junction contacts coupled to respective end portions of odd-numbered active regions among the plurality of active regions; and
   foil ring the second junction contacts coupled to respective end portions of even-numbered active regions among the plurality of active regions.

13. The method of claim 12, wherein the end portions of the odd-numbered active regions are disposed opposite the end portions of the even-numbered active regions.

14. The method of claim 9, further comprising:
   forming a second contact pad coupled to the second junction contacts.

15. The method of claim 14, wherein a first terminal (+) is coupled to the first contact pad, and a second terminal (−) is coupled to the second contact pad.

16. A method of testing a semiconductor device which includes a plurality of second gate patterns and a plurality of second gate contacts formed over first and second active regions in a scribe region and respectively having the same structure as first gate patterns and first gate contacts of an X decoder, the method comprising:
   coupling a first terminal (+) to at least one first contact coupled to the first active regions;
   coupling a second terminal (−) to at least one second contact coupled to the second active regions; and
   testing whether or not current flows between the first terminal and the second terminal.

17. The method of claim 16, wherein the first gate patterns and the first gate contacts of the X decoder are determined to be aligned with each other in the testing of whether or not the current flows between the first terminal and the second terminal.

* * * * *